(12) United States Patent
Gu et al.

(10) Patent No.: US 12,100,690 B2
(45) Date of Patent: Sep. 24, 2024

(54) LED DISPLAY UNIT GROUP AND DISPLAY PANEL

(71) Applicant: FOSHAN NATIONSTAR OPTOELECTRONICS CO., LTD., Foshan (CN)

(72) Inventors: Feng Gu, Foshan (CN); Chuanbiao Liu, Foshan (CN); Kuai Qin, Foshan (CN); Kailiang Fan, Foshan (CN)

(73) Assignee: FOSHAN NATIONSTAR OPTOELECTRONICS CO., LTD., Foshan (CN)

( * ) Notice: Subject to any disclaimer, the term of this patent is extended or adjusted under 35 U.S.C. 154(b) by 742 days.

(21) Appl. No.: 17/281,433

(22) PCT Filed: Sep. 26, 2019

(86) PCT No.: PCT/CN2019/108030
§ 371 (c)(1),
(2) Date: Mar. 30, 2021

(87) PCT Pub. No.: WO2020/063712
PCT Pub. Date: Apr. 2, 2020

(65) Prior Publication Data
US 2021/0398954 A1    Dec. 23, 2021

(30) Foreign Application Priority Data
Sep. 30, 2018    (CN) .......................... 201811162175.7

(51) Int. Cl.
*H01L 25/075*    (2006.01)
*H01L 23/544*    (2006.01)
*H01L 33/62*    (2010.01)

(52) U.S. Cl.
CPC ........ *H01L 25/0753* (2013.01); *H01L 23/544* (2013.01); *H01L 33/62* (2013.01); *H01L 2223/54426* (2013.01)

(58) Field of Classification Search
None
See application file for complete search history.

(56) References Cited

U.S. PATENT DOCUMENTS 6,784,458 B1    8/2004    Wang et al.
9,178,115 B2    11/2015   Suzuki et al.
(Continued)

FOREIGN PATENT DOCUMENTS

| CN | 103258947 A | 8/2013 |
| CN | 203826384 U | 9/2014 |

(Continued)

OTHER PUBLICATIONS

International Search Report Form PCT/ISA/210, and Written Opinion Form PCT/ISA/237, International Application No. PCT/CN2019/108030, pp. 1-10 International Filing Date Sep. 26, 2019 mailing date of search report Dec. 27, 2019.

(Continued)

*Primary Examiner* — Feifei Yeung Lopez
(74) *Attorney, Agent, or Firm* — Culhane PLLC; Stephen J. Weed (57) ABSTRACT

Provided is an LED display unit group, comprising: an insulation substrate, a front circuit board, and a back circuit board. The front circuit board is divided into pixel areas arranged in an array of 2m rows and 2n columns. Each pixel area comprises three A-electrode pads, three LED light-emitting chips of different light emission colors, and B-electrode pads corresponding to the three LED light-emitting chips. In each pixel area, the electrode A of each LED light-emitting chip is electrically connected to a correspond- (Continued)

ing A-electrode pad, and the electrode B of each LED light-emitting chip is electrically connected to a corresponding B-electrode pad. In the same column of pixel areas, B-electrode pads corresponding to all LED light-emitting chips are electrically connected to each other. In the same row of pixel areas, A-electrode pads corresponding to LED light-emitting chips of the same light emission color are electrically connected to each other.

11 Claims, 6 Drawing Sheets

(56) References Cited

U.S. PATENT DOCUMENTS

| | | | | |
|---|---|---|---|---|
| 2010/0243030 | A1* | 9/2010 | Yago | H01L 31/03925 |
| | | | | 257/E31.119 |
| 2010/0259920 | A1 | 10/2010 | Lin | |
| 2011/0186870 | A1* | 8/2011 | Ying | H01L 33/62 |
| | | | | 257/E33.056 |
| 2015/0348906 | A1* | 12/2015 | Park | H01L 23/49827 |
| | | | | 257/774 |
| 2015/0380355 | A1* | 12/2015 | Rogers | H01L 23/5387 |
| | | | | 257/773 |
| 2019/0280163 | A1* | 9/2019 | Li | H01L 25/0753 |
| 2021/0183943 | A1* | 6/2021 | Mori | H01L 27/156 |

FOREIGN PATENT DOCUMENTS

| | | |
|---|---|---|
| CN | 204102897 U | 1/2015 |
| CN | 104409620 A | 3/2015 |
| CN | 204927335 U | 12/2015 |
| CN | 206497891 U | 9/2017 |
| CN | 207425855 U | 5/2018 |
| CN | 10859807 A | 9/2018 |
| CN | 108511431 A | 9/2018 |
| CN | 108598071 A | 9/2018 |
| CN | 207925040 U | 9/2018 |
| CN | 109147584 A | 1/2019 |
| CN | 209015627 U | 6/2019 |
| JP | 6170232 B1 | 7/2017 |
| KR | 200430821 Y1 | 11/2006 |
| WO | 2018088671 A1 | 5/2018 |

OTHER PUBLICATIONS

Translated Korean Office Action, Dated Jul. 30, 2022. pp. 1-8.

* cited by examiner

LED DISPLAY UNIT GROUP AND DISPLAY PANEL

CROSS-REFERENCE TO RELATED APPLICATIONS

This is a National Stage Application filed under 35 U.S.C. 371 based on International Patent Application No. PCT/CN2019/108030, filed on Sep. 26, 2019, which claims priority to Chinese Patent Application No. 201811162175.7 filed on Sep. 30, 2018, the disclosures of both of which are incorporated herein by reference in their entireties.

TECHNICAL FIELD

This application claims priority to Chinese Patent Application No. 201811162175.7 filed with the CNIPA Sep. 30, 2018, the disclosure of which is incorporated herein by reference in its entirety.

Embodiments of the present application relate to the field of a light emitting diode (LED) display technology, for example, an LED display unit group and a display panel.

BACKGROUND

As the indoor display application technology is continuously improved, the indoor small-spacing LED display screen has a technology developing space in the future. To replace the liquid crystal display (LCD) or digital light processing (DLP) indoor high-definition display products, the required standards of pixel unit density of the indoor small-spacing LED display screen are higher and higher, that is, a spacing between pixel units is required to be as small as possible.

Figure 1:
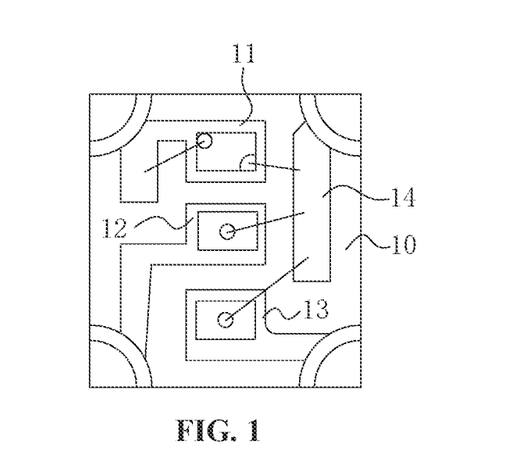
FIG. 1 is a front wiring diagram of a light-emitting unit in the related art.

The LED display screen consists of multiple independent LED light-emitting units arranged in an array. FIG. 1 is a front wiring diagram of a light-emitting unit in the related art. As shown in FIG. 1, each light-emitting unit includes an insulation substrate 10, four metal pads, an anode pin, three cathode pins, and three LED chips of red, green and blue, respectively. The three LED chips are fixed to a first die bond pad 11, a second die bond pad 12, and a third die bond pad 13, respectively. The anodes of the three LED chips are connected to a common anode pad 14 and connected to the anode pin on the back surface of the insulation substrate 10 through a metal via. The cathode of each of the three LED chips is connected to a respective cathode pad, and to a respective cathode pin. In FIG. 1, the LED chips on the second die bond pad 12 and the third die bond pad 13 are each a vertical chip, and their cathodes are directly fixed on the second die bond pad 12 and the third die bond pad 13 through a conductive material, respectively. The second die bond pad 12 and the third die bond pad 13 serve as cathode pads of the two chips on the second die bond pad 12 and the third die bond pad 13. A part of the first die bond pad 11 serves as the cathode pad of the chip on the first die bond pad 11. The three cathode pads are connected to three cathode pins on the back surface of the insulation substrate through metal vias, respectively. As can be seen from FIG. 1, the area of the die bond pad provided for fixing the LED chip is large, the four metal pads and the metal wires occupy most of the area of the front surface of the insulation substrate 10, but the reduction in the size of the pads and the metal wires results in an increase in the wire resistance. Meanwhile, because the density of the light-emitting units on the display panel is high and the number of pins is too large, it is difficult for the PCB factory to control the design and arrangement of the circuits and wires in the subsequent panel manufacturing process, and the complexity of the design and arrangement is high, which results in poor stability. Therefore, it is difficult to reduce the size of the light-emitting unit, and it is difficult for the light-emitting unit in the related art to implement an LED display screen having a spacing between pixel units of 1.0 mm or less.

SUMMARY

The present disclosure provides an LED display unit group and a display panel, to avoid a case where the size of the display unit cannot be reduced due to the structure of the light-emitting unit in the related art and implement an LED display screen having spacing between pixel units of 1.0 mm or less on the premise of ensuring good reliability and low cost.

In a first aspect, an embodiment of the present disclosure provides an LED display unit group. The LED display unit group includes: an insulation substrate, a front circuit board disposed on a front surface of the insulation substrate, and a back circuit board disposed on a back surface of the insulation substrate, where the insulation substrate is provided with metal vias for connecting the front circuit board and the back circuit board. The front circuit board is divided into pixel areas arranged in an array of 2m rows and 2n columns. Each of the pixel areas includes a first A-electrode pad, a second A-electrode pad, a third A-electrode pad, three LED light-emitting chips of different light emission colors, and B-electrode pads corresponding to the three LED light-emitting chips of different light emission colors. The three LED light-emitting chips of different light emission colors are a first LED light-emitting chip, a second LED light-emitting chip, and a third LED light-emitting chip, respectively. Each of the three LED light-emitting chips includes an electrode A and an electrode B, and a polarity of the electrode A is opposite to a polarity of the electrode B. n is a positive integer greater than or equal to 1 and m is a positive integer greater than or equal to 1. In each of the pixel areas, the electrode A of each of the three LED light-emitting chips is electrically connected to a corresponding A-electrode pad, and the electrode B of each of the three LED light-emitting chips is electrically connected to a corresponding B-electrode pad. In the same column of pixel areas, B-electrode pads corresponding to all LED light-emitting chips are electrically connected to each other. In the same row of pixel areas, A-electrode pads corresponding to LED light-emitting chips of the same light emission color are electrically connected to each other.

In one embodiment, the thickness of the front circuit board ranges from 0.1 mm to 0.3 mm.

In one embodiment, the back circuit board includes 6m A-electrode pins and 2n common B-electrode pins. In the same row of pixel areas, A-electrode pads corresponding to LED light-emitting chips of the same light emission color are electrically connected to each other and are electrically connected to an A-electrode pin corresponding to the LED light-emitting chips of the same light emission color in the row of pixel areas. In the same column of pixel areas, B-electrode pads corresponding to all LED light-emitting chips are electrically connected to each other and are electrically connected to a common B-electrode pin corresponding to the column of pixel areas.

In one embodiment, in each of the pixel areas, the B-electrode pads corresponding to the three LED light-emitting chips are different portions of a first metal pad, and the electrode B of each of the three LED light-emitting chips is electrically connected to a corresponding one portion among the different portions of the first metal pad.

In one embodiment, in the same column of pixel areas, B-electrode pads corresponding to all LED light-emitting chips are different portions of a second metal pad, and the electrode B of each of all the LED light-emitting chips is electrically connected to a corresponding one portion among the different portions of the second metal pad.

In one embodiment, n=1, and m=1. In the same column of pixel areas, all B-electrode pads are arranged in a "1" shape along a column direction, two columns of B-electrode pads are disposed in edge areas on two opposite sides of the front circuit board, and A-electrode pads are disposed between the two columns of B-electrode pads.

In one embodiment, in the same row of pixel areas, A-electrode pads corresponding to LED light-emitting chips of the same light emission color are different portions of a third metal pad, and the third metal pad is disposed along a row direction.

In one embodiment, the second metal pad is directly electrically connected to the common B-electrode pin corresponding to the column of pixel areas through one of the metal vias.

In one embodiment, the third metal pad is directly electrically connected to a corresponding A-electrode pin through one of the metal vias, or the third metal pad extends to the back circuit board through one of the metal vias and is electrically connected to a corresponding A-electrode pin through a metal wire on the back circuit board.

In one embodiment, the front surface of the insulation substrate is provided with a first identification mark for position identification.

In one embodiment, an ink layer is provided between adjacent rows of pixel areas; an ink layer is provided between adjacent columns of pixel areas; or an ink layer is provided between adjacent rows of pixel areas and an ink layer is provided between adjacent columns of pixel areas.

In one embodiment, the three LED light-emitting chips of different light emission colors include a red LED light-emitting chip, a green LED light-emitting chip, and a blue LED light-emitting chip.

In one embodiment, the back surface of the insulation substrate is provided with an insulation layer covering back surface metal wires on the back circuit board and the metal vias electrically connected to the back surface metal wires.

In one embodiment, the back surface of the insulation substrate is provided with second identification marks for identifying polarities of pins.

In one embodiment, the insulation layer includes two insulation materials of different colors. The boundary line of the two insulation materials of different colors divides the insulation layer into two different colored portions to form the second identification marks.

In a second aspect, an embodiment of the present disclosure further provides a display panel that includes any one of the LED display unit groups described in the first aspect of the present disclosure.

DETAILED DESCRIPTION

In the embodiments of the present disclosure, the position terms such as "up", "down", "top", and "bottom" used herein are generally used to describe the positional relationship of the components with respect to the direction shown in the drawings or the upright, vertical, or gravity direction unless otherwise specified to the contrary.

Figure 2:
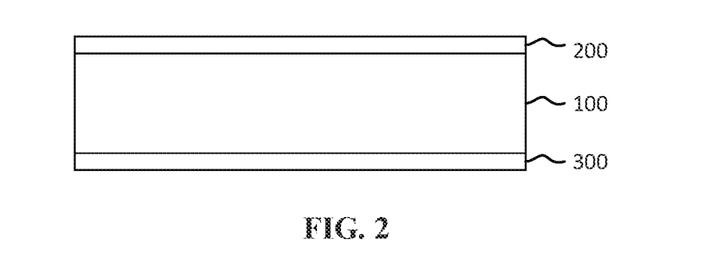
FIG. 2 is a front view of an LED display unit group according to an embodiment of the present disclosure.

An embodiment of the present disclosure provides an LED display unit group. FIG. 2 is a front view of an LED display unit group according to an embodiment of the present disclosure. As shown in FIG. 2, the LED display unit group includes an insulation substrate 100, a front circuit board 200 disposed on a front surface of the insulation substrate, and a back circuit board 300 disposed on a back surface of the insulation substrate, where the insulation substrate 100 is provided with metal vias for connecting the front circuit board 200 and the back circuit board 300.

The front circuit board is divided into pixel areas arranged in an array of 2m rows and 2n columns, where n and m are each a positive integer greater than or equal to 1. Exemplarily, the scheme of the present disclosure is described by using an example in which m=1 and n=1 in this embodiment. Exemplarily, the LED light-emitting chips may be each a flip-chip LED chip including an electrode A and an electrode B. The polarity of the electrode A is opposite to that of the electrode B. The electrode A and the electrode B are disposed on the side opposite to the light-emitting side of the LED light-emitting chip. The electrode A and the electrode B of the LED light-emitting chip are fixed to an A-electrode pad and a B-electrode pad, respectively, by a conductive material. Since the flip chip is adopted, there is no need to connect bonding wires of the electrodes of the light-emitting chip and the pads, thereby simplifying the process and reducing the cost. In this embodiment and subsequent embodiments, the present disclosure is described by using an example in which the electrode A is the anode of the LED chip and the electrode B is the cathode of the LED chip. Accordingly, the A-electrode pad is the anode pad, and the B-electrode pad is the cathode pad.

Figure 3:
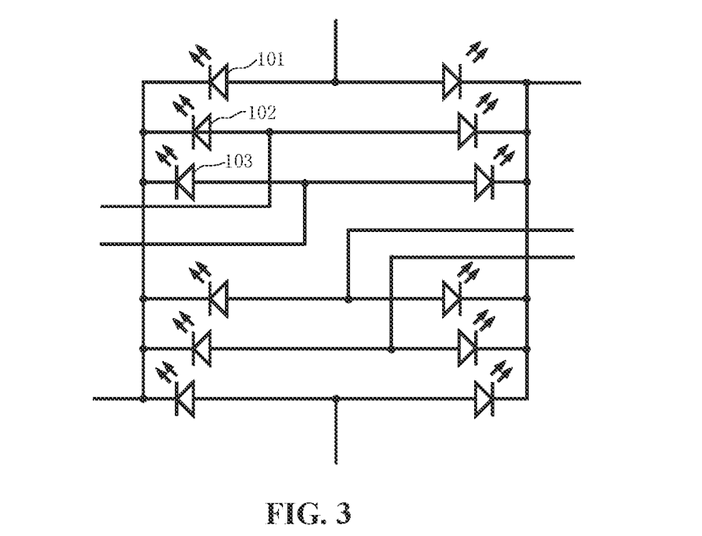
FIG. 3 is a schematic diagram of a circuit structure of an LED display unit group according to an embodiment of the present disclosure.

FIG. 3 is a schematic diagram of the circuit structure of an LED display unit group according to an embodiment of the present disclosure. As shown in FIG. 3, each pixel area includes three LED light-emitting chips of different light emission colors, that is, a first LED light-emitting chip 101, a second LED light-emitting chip 102, and a third LED light-emitting chip 103. In each column of pixel areas, the cathodes of all LED light-emitting chips in two pixel areas are connected to each other. In each row of the pixel areas, the anodes of two first LED light-emitting chips 101 are connected to each other, the anodes of two second LED light-emitting chips 102 are connected to each other, and the anodes of two third LED light-emitting chips 103 are connected to each other.

Figure 4:
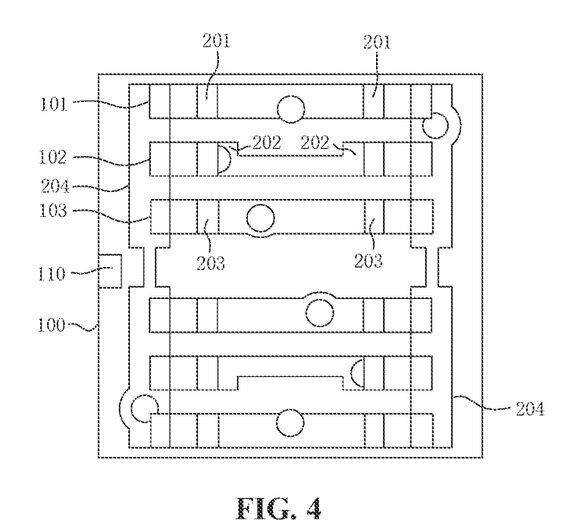
FIG. 4 is a wiring diagram of a front circuit board of an LED display unit group according to an embodiment of the present disclosure.

FIG. 4 is a wiring diagram of a front circuit board of an LED display unit group according to an embodiment of the present disclosure. As shown in FIG. 4, the LED display unit group includes four pixel areas P arranged in an array. Each of the four pixel areas P includes a first anode pad 201, a second anode pad 202, a third anode pad 203, a first metal pad 204, and three LED light-emitting chips of different light emission colors that are a first LED light-emitting chip 101, a second LED light-emitting chip 102, and a third LED light-emitting chip 103, respectively.

In each pixel area, the anode of each of the three LED light-emitting chips is electrically connected to a corresponding anode pad, that is, the anode of the first LED light-emitting chip 101 is fixed to the first anode pad 201 by a conductive material, the anode of the second LED light-emitting chip 102 is fixed to the second anode pad 202 by a conductive material, and the anode of the third LED light-emitting chip 103 is fixed to the third anode pad 203 by a conductive material. The cathode of each of the three LED light-emitting chips is electrically connected to the first metal pad 204, that is, the cathode pads corresponding to the three LED light-emitting chips are different portions of the first metal pad 204, and the cathode of each of the three LED light-emitting chips is fixed to a corresponding one portion among the different portions of the first metal pad 204 by a conductive material. It is to be noted that, in this embodiment, the cathode pads may also be in the form of three separate cathode pads that are electrically connected to each other. In each pixel area, the cathode of each of the three LED light-emitting chips is electrically connected to a corresponding cathode pad, and the three cathode pads are electrically connected to each other.

In the same column of pixel areas, the common cathode pads corresponding to all LED light-emitting chips are electrically connected to each other and are electrically connected to a common cathode pin corresponding to this column of pixel units. In the same row of pixel areas, anode pads corresponding to LED light-emitting chips of the same light emission color are electrically connected to each other and are electrically connected to an anode pin corresponding to the LED light-emitting chips of the same light emission color in this row of pixel units. Exemplarily, the common cathode pads corresponding to all LED light-emitting chips in a certain column of pixel areas may be electrically connected to each other and are electrically connected to a common cathode pin corresponding to this column of pixel units; and in a certain row of pixel areas, anode pads corresponding to LED light-emitting chips of the same light emission color may be electrically connected to each other and are electrically connected to an anode pin corresponding to the LED light-emitting chips of the same light emission color in this row of pixel units. In the related art, 16 pins are required for four separate light-emitting units, whereas in this embodiment, one display unit group includes four light-emitting units, but the number of pins is greatly reduced.

In the LED display unit group provided by the embodiment of the present disclosure, (2m×2n) pixel areas are packaged together to form one display unit group. Each pixel area includes a first A-electrode pad, a second A-electrode pad, a third A-electrode pad, three LED light-emitting chips of different light emission colors, and B-electrode pads corresponding to the three LED light-emitting chips of different light emission colors. In the same column of pixel areas, B-electrode pads corresponding to all LED light-emitting chips are electrically connected to each other. In the same row of pixel areas, A-electrode pads corresponding to LED light-emitting chips of the same light emission color are electrically connected to each other. In this way, when the display panel is to be subsequently formed, the number of pins is reduced, thereby simplifying the circuit design of the PCB circuit board and implementing the LED display screen having a spacing between pixel units of 1.0 mm or less while ensuring good reliability and low cost.

In one embodiment, the thickness of the front circuit board ranges from 0.1 mm to 0.3 mm. The front circuit board is formed by etching a metal foil disposed on the front surface of the insulation substrate. Since the metal foil is thick, the accuracy of the line width on the etched circuit board is poor. Therefore, when such an etched circuit board is applied to display units of the small-spacing display screen (for example, a display screen having a spacing between pixels of 1.0 mm or less), it easily occurs that lines are crossed, and a case in which the LED light-emitting chips are not fixed stably due to the out-of-place of die bond may also happen. In the embodiment of the present disclosure, before the metal foil is etched to form the front circuit board, the surface of the metal foil is etched to reduce the thickness of the metal foil, and after the metal vias are formed by drilling, copper electroplating and copper deposition, the surface of the metal foil is etched again to reduce the thickness of copper. In this way, in the subsequent etching process for forming the metal circuit, the etching precision can be improved. Therefore, the precision of the line width on the etched front circuit board becomes high, and the thickness of the etched front circuit board ranges from 0.1 mm to 0.3 mm. In the related art, the thickness of the front circuit board ranges from 0.3 mm to 0.5 mm.

Figure 5:
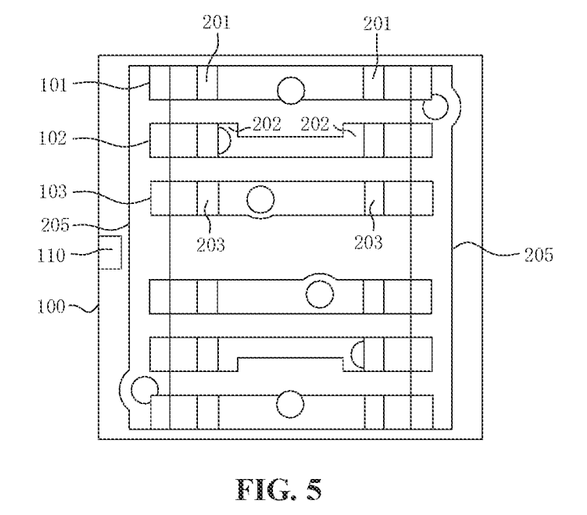
FIG. 5 is a wiring diagram of a front circuit board of another LED display unit group according to an embodiment of the present disclosure.

FIG. 5 is a wiring diagram of a front circuit board of another LED display unit group according to an embodiment of the present disclosure. As shown in FIG. 5, in one embodiment, in the same column of pixel areas, cathode pads corresponding to all LED light-emitting chips are different portions of a second metal pad 205, and the cathode of each of all the LED light-emitting chips is electrically connected to a corresponding one portion among the different portions of the second metal pad 205. The second metal pad 205 is in the form of a long strip and is arranged in the column direction. In each pixel area, three anode pads are arranged parallel to the second metal pad 205 along the column direction and are disposed on the same side of the second metal pad 205.

The cathodes of the first LED light-emitting chip 101, the second LED light-emitting chip 102, and the third LED light-emitting chip 103 in the same column of pixel areas are each fixed at corresponding different positions of the second metal pad 205 by a conductive material. In each pixel area, the anodes of the first LED light-emitting chip 101, the second LED light-emitting chip 102, and the third LED light-emitting chip 103 are each fixed to the first anode pad 201, the second anode pad 202, and the third anode pad 203, respectively, by a conductive material.

In one embodiment, as shown in FIGS. 4 and 5, in the same column of pixel areas, all cathode pads are arranged in a "1" shape along the column direction, two columns of cathode pads are disposed in edge areas on two opposite sides of the front circuit board, and anode pads are disposed between the two columns of cathode pads. This arrangement of the pads makes the arrangement of the LED light-emitting chips and the pads compact and reduces the size of the display unit group.

Figure 6:
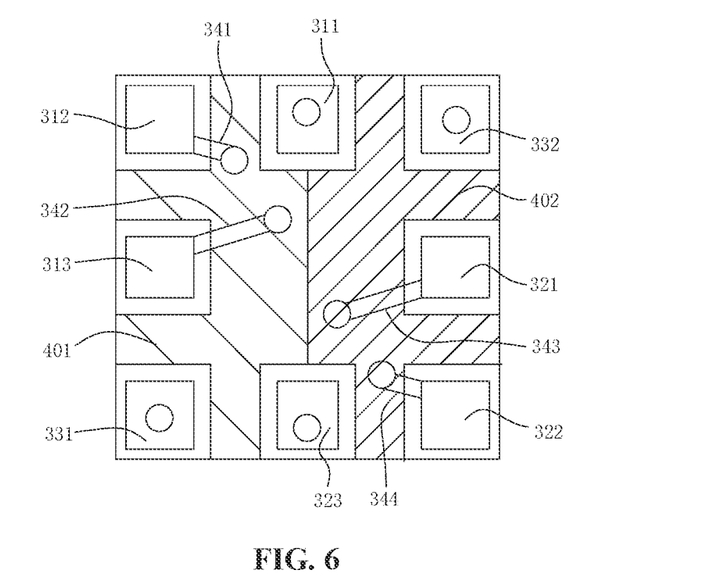
FIG. 6 is a wiring diagram of a back circuit board of the LED display unit group in FIG. 5.

FIG. 6 is a wiring diagram of a back circuit board of the LED display unit group in FIG. 5. In one embodiment, as shown in FIGS. 5 and 6, the back circuit board includes 6 anode pins and 2 common cathode pins. In each row of pixel areas, first anode pads 201 in two pixel areas are electrically connected to each other and are electrically connected to a first anode pin corresponding to a corresponding row of pixel areas, second anode pads 202 in two pixel areas are electrically connected to each other and are electrically connected to a second anode pin corresponding to a corresponding row of pixel areas, and third anode pads 203 in two pixel areas are electrically connected to each other and are electrically connected to a third anode pin corresponding to a corresponding row of pixel areas. The second metal pad 205 of each column of pixel areas is directly electrically connected to the common cathode pin corresponding to a corresponding column of pixel areas through a metal via.

In one embodiment, with reference to FIGS. 4 and 5, in the same row of pixel areas, anode pads of two LED light-emitting chips of the same light emission color are different portions of a third metal pad, and the third metal pad is disposed along the row direction. For example, in the first row of pixel areas, the third metal pad is in the form of a long strip or an approximately long strip and is disposed in the row direction, and the two first anode pads 201 are two end portions of the third metal pad. The second anode pad 202 and the third anode pad 203 are similar to the first anode pad 201, which will not be repeated herein.

The third metal pad is directly electrically connected to a corresponding anode pin through a metal via, or the third metal pad extends to the back circuit board through a metal via and is electrically connected to a corresponding anode pin through a metal wire on the back circuit board. In one embodiment, as shown in FIGS. 5 and 6, in the first row of pixel areas, a third metal pad on which two first anode pads 201 are disposed is directly electrically connected to the first anode pin 311 corresponding to this row of pixel areas through a metal via disposed in the middle of the third metal pad; a third metal pad on which two second anode pads 202 are disposed extends to the back circuit board 300 through a metal via and is electrically connected to the second anode pin 312 corresponding to this row of pixel areas through a first metal wire 341 on the back circuit board 300; and a third metal pad on which two third anode pads 203 are disposed extends to the back circuit board 300 through a metal via and is electrically connected to the third anode pin 313 corresponding to this row of pixel areas through a second metal wire 342 on the back circuit board 300. In the second row of pixel areas, a third metal pad on which two first anode pads 201 are disposed extends to the back circuit board 300 through a metal via and is electrically connected to the first anode pin 321 corresponding to this row of pixel areas through a third metal wire 343 on the back circuit board 300; a third metal pad on which two second anode pads 202 are disposed extends to the back circuit board 300 through a metal via and is electrically connected to the second anode pin 322 corresponding to this row of pixel areas through a fourth metal wire 344 on the back circuit board 300; and a third metal pad on which two third anode pads 203 are disposed is directly electrically connected to the first anode pin 323 corresponding to this row of pixel areas through a metal via disposed in the middle of the third metal pad. In the first column of pixel areas, the second metal pad 205 on which all cathode pads are disposed is directly electrically connected to the common cathode pin 331 corresponding to this column of pixel areas through a metal via. In the second column of pixel areas, the second metal pad 205 on which all cathode pads are disposed is directly electrically connected to the common cathode pin 332 corresponding to this column of pixel areas through a metal via. The eight pins are evenly distributed along the edge areas of the back circuit board 300, and the two common cathode pins 331 and 332 are respectively disposed in the areas where the two diagonally opposite corners of the back circuit board 300 are located.

Figure 7:
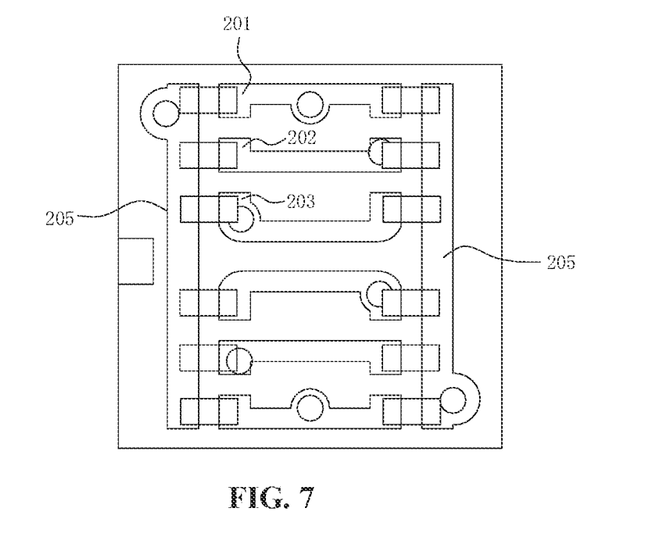
FIG. 7 is a wiring diagram of a front circuit board of another LED display unit group according to an embodiment of the present disclosure.
Figure 8:
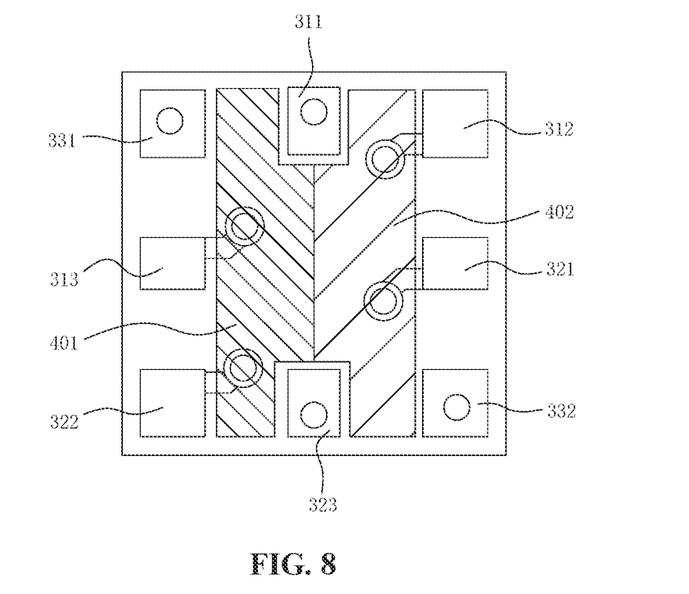
FIG. 8 is a wiring diagram of a back circuit board of the LED display unit group in FIG. 7.
Figure 9:
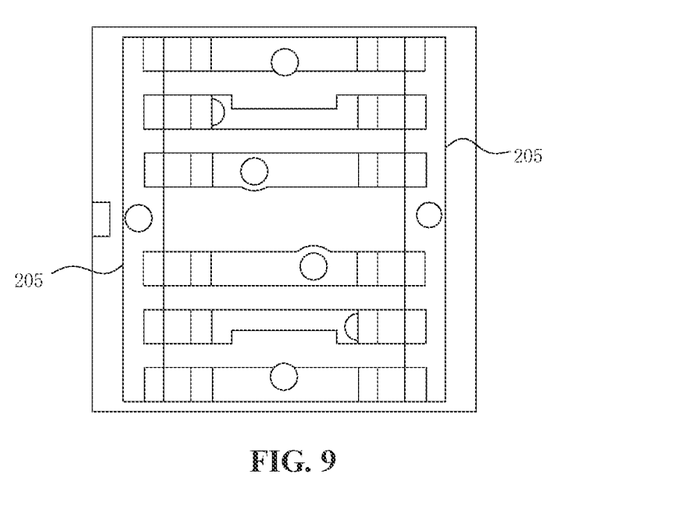
FIG. 9 is a wiring diagram of a front circuit board of another LED display unit group according to an embodiment of the present disclosure.
Figure 10:
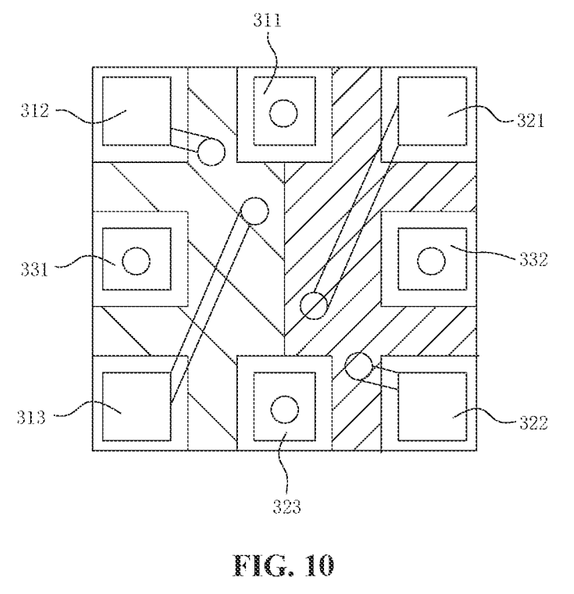
FIG. 10 is a wiring diagram of a back circuit board of the LED display unit group in FIG. 9.

It is to be noted that the metal pad on which anode pads are disposed in the above embodiments may also be in the form of an approximately long strip and the position of each pin may correspondingly vary according to the different positions of the metal vias. FIG. 7 is a wiring diagram of a front circuit board of another LED display unit group according to an embodiment of the present disclosure. FIG. 8 is a wiring diagram of a back circuit board of the LED display unit group in FIG. 7. As shown in FIG. 7, the LED light-emitting chips are fixed by both ends of the third metal pad, that is, the anode pads 201, 202, and 203 are slightly larger than the other areas or are bent at an angle to facilitate the fixing of the LED light-emitting chips. The positions on the metal pads for disposing the metal vias may be slightly larger than the other areas to facilitate the drilling. As shown in FIGS. 7 and 8, since the positions of metal vias on the second metal pads 205 change, the positions of the common cathode pins 331 and 332 change from the areas where two diagonally opposite corners are located to the areas where the other two diagonally opposite corners are located, thereby causing the positions of the anode pins 312 and 322 to change. FIG. 9 is a wiring diagram of a front circuit board of another LED display unit group according to an embodiment of the present disclosure. FIG. 10 is a wiring diagram of a back circuit board of the LED display unit group in FIG. 9. With reference to FIGS. 9 and 10, the metal via on each of the second metal pads 205 is disposed at an intermediate position of the second metal pad 205, and each of the second metal pads 205 is directly electrically connected to the corresponding common cathode pin through the metal via. The two common cathode pins 331 and 332 are disposed in the edge areas of the back circuit board, are located on bisector lines of the two rows of pixel areas, and are arranged symmetrically with respect to the column bisector lines of the pixel areas.

Figure 11:
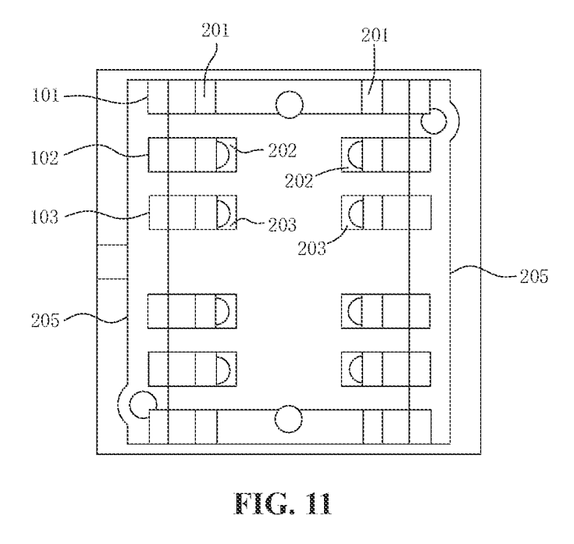
FIG. 11 is a wiring diagram of a front circuit board of another LED display unit group according to an embodiment of the present disclosure.
Figure 12:
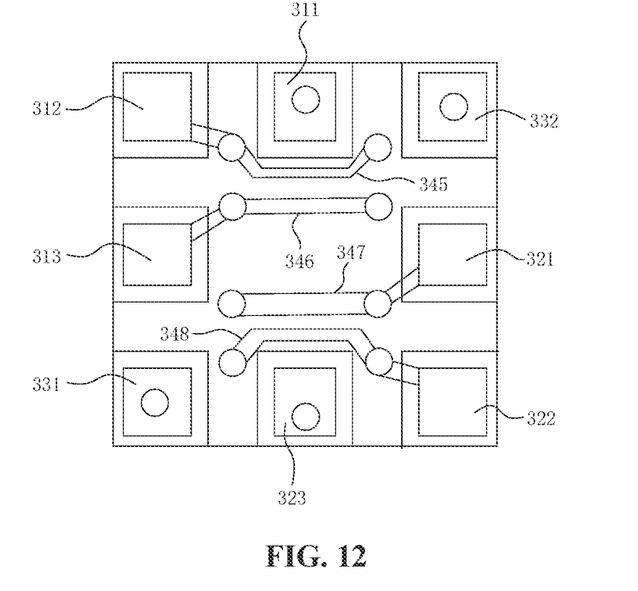
FIG. 12 is a wiring diagram of a back circuit board of the LED display unit group in FIG. 11.

FIG. 11 is a wiring diagram of a front circuit board of another LED display unit group according to an embodiment of the present disclosure. FIG. 12 is a wiring diagram of a back circuit board of the LED display unit group in FIG. 11. In one embodiment, in this embodiment, in the first row of pixel areas, the first anode pads 201 of two first LED light-emitting chips 101 are different portions of the same metal pad, and the metal pad is directly electrically connected to the corresponding first anode pin 311 through a metal via; the second anode pad 202 of each of the two second LED light-emitting chips 102 extends to the back circuit board though a metal via and electrically connected to the corresponding second anode pin 312 through a fifth metal wire 345 on the back circuit board; and the third anode pad 203 of each of the two third LED light-emitting chips 103 extends to the back circuit board though a metal via and electrically connected to the corresponding third anode pin 313 through a sixth metal wire 346 on the back circuit board.

In the second row of pixel areas, the first anode pad 201 of each of the two first LED light-emitting chips 101 extends to the back circuit board through a metal via and electrically connected to the corresponding first anode pin 321 through a seventh metal wire 347 on the back circuit board; the second anode pad 202 of each of the two second LED light-emitting chips 102 extends to the back circuit board though a metal via and electrically connected to the corresponding second anode pin 322 through an eighth metal wire 348 on the back circuit board; and the third anode pads 203 of two third LED light-emitting chips 103 are different portions of the same metal pad, and the metal pad is directly electrically connected to the corresponding third anode pin 323 through a metal via.

In the first column of pixel areas, the second metal pad 205 on which all cathode pads are disposed is directly electrically connected to the common cathode pin 331 corresponding to this column of pixel areas through a metal via. In the second column of pixel areas, the second metal pad 205 on which all cathode pads are disposed is directly electrically connected to the common cathode pin 332 corresponding to this column of pixel areas through a metal via.

In an embodiment, with reference to FIGS. 4, 5, 9, and 11, in the above embodiments, the front surface of the insulation substrate 100 is provided with a first identification mark 110 for position identification, and the first identification mark 110 may be disposed in a certain edge area of the front surface of the insulation substrate 100. In the process of fixing the LED light-emitting chips on the front circuit board 200, the insulation substrate including the circuit boards needs to be fixed at a certain position by using a clamping tool. For example, after the fixing, the first identification mark uniformly faces to the right to avoid the out-of-place of the die bond. The first identification mark 110 is used for quickly identifying whether the position of the insulation substrate is correct.

Figure 13:
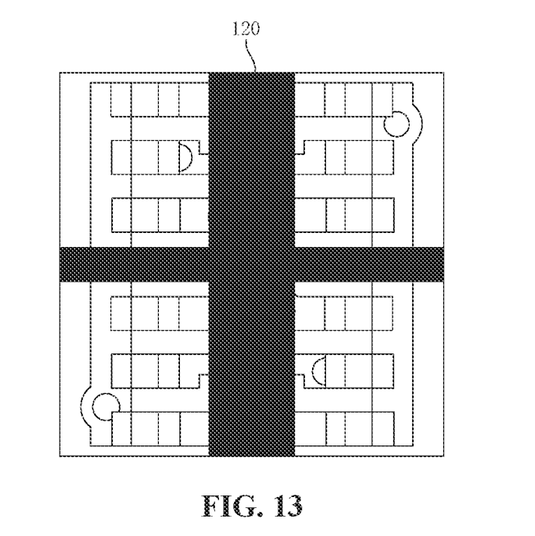
FIG. 13 is a top view of an LED display unit group according to an embodiment of the present disclosure.

FIG. 13 is a top view of an LED display unit group according to an embodiment of the present disclosure. As shown in FIG. 13, in one embodiment, an ink layer 120 is provided between adjacent rows of pixel areas, and an ink layer 120 is provided between adjacent columns of pixel areas. The ink may be black ink or any other dark ink and is formed by ink-jet printing technology to improve the contrast of the device surface and further improve the fidelity of the display color. In addition, in some embodiments, the ink layer may only be provided between adjacent rows of pixel areas or the ink layer may be only provided between adjacent columns of pixel areas.

In one embodiment, the metal via is filled with a first insulation material that does not extend out from the upper and lower surfaces of the insulation substrate. The first insulation material includes resin or green oil, and the first insulation material does not exceed out from the upper and lower surfaces of the insulation substrate. The advantage of such filling is to increase the contact area between the encapsulation material and the insulation substrate 100 during the subsequent device encapsulation, thereby strengthening the adhesion between the encapsulation material and the insulation substrate 100 and improving the sealing performance.

In one embodiment, the three LED light-emitting chips of different light emission colors are a red LED light-emitting chip, a green LED light-emitting chip, and a blue LED light-emitting chip, respectively. To satisfy different wiring demands on the PCB, the first LED light-emitting chip, the second LED light-emitting chip, and the third LED light-emitting chip may be red, green and blue LED light-emitting chips, respectively; or may be blue, green and red LED light-emitting chips, respectively; or may be arranged in other manners, which is not limited herein.

In one embodiment, the back surface of the insulation substrate 100 is provided with an insulation layer covering back surface metal wires on the back circuit board and metal vias electrically connected to the back surface metal wires. The material of the insulation layer includes white oil, resin, green oil, or the like for the purpose of insulation and protection.

In one embodiment, the back surface of the insulation substrate 100 is provided with second identification marks for identifying polarities of pins. In the embodiment of the present disclosure, the insulation substrate includes two insulation materials 401 and 402 of different colors, for example, white oil and green oil. The boundary line of the two insulation materials 401 and 402 of different colors divides the insulation layer into two different colored portions to form the second identification marks used for identifying the polarities of pins. In another embodiment of the present disclosure, one insulation layer (for example, white oil) may be coated on the insulation substrate 100 to cover the back surface metal wires on the back circuit board and the metal vias electrically connected to the back surface metal wires, and then another insulation material (for example, green oil) having a large color difference from the insulation layer may be coated on the surface of the insulation layer, which may be in a triangular shape or in other shapes having a function of identifying the polarities of the pins. Alternatively, one half of the surface of the insulation layer (white oil) may be coated with green oil, and the boundary line between the white oil and the green oil divides the back surface of the LED display unit group into two different colored portions to form the identification marks as shown in FIGS. 6, 8 and 10.

An embodiment of the present disclosure further provides a display panel which includes any one of the LED display unit groups described in the above embodiments.

What is claimed is:

1. A light emitting diode (LED) display unit group, comprising: an insulation substrate, a front circuit board disposed on a front surface of the insulation substrate, and a back circuit board disposed on a back surface of the insulation substrate;

wherein the insulation substrate is provided with metal vias for connecting the front circuit board and the back circuit board;

wherein the front circuit board is divided into pixel areas arranged in an array of 2m rows and 2n columns, and each of the pixel areas comprises a first A-electrode pad, a second A-electrode pad, and a third A-electrode pad, three LED light-emitting chips of different light emission colors, and B-electrode pads corresponding to the three LED light-emitting chips of different light emission colors; wherein the three LED light-emitting chips of different light emission colors are a first LED light-emitting chip, a second LED light-emitting chip, and a third LED light-emitting chip, respectively, each of the three LED light-emitting chips comprises an electrode A and an electrode B, a polarity of the electrode A is opposite to a polarity of the electrode B, n is a positive integer greater than or equal to 1, and m is a positive integer greater than or equal to 1;

in each of the pixel areas, the electrode A of each of the three LED light-emitting chips is electrically connected to a corresponding A-electrode pad, and the electrode B of each of the three LED light-emitting chips is electrically connected to a corresponding B-electrode pad;

in a same column of pixel areas, B-electrode pads corresponding to all LED light-emitting chips are electrically connected to each other; and in a same row of pixel areas, A-electrode pads corresponding to LED light-emitting chips of a same light emission color are electrically connected to each other;

wherein the back circuit board comprises 6m A-electrode pins and 2n common B-electrode pins;

in a same row of pixel areas, A-electrode pads corresponding to LED light-emitting chips of a same light emission color are electrically connected to each other and are electrically connected through at least one of the metal vias to an A-electrode pin corresponding to the LED light-emitting chips of the same light emission color in the row of pixel areas; and in a same column of pixel areas, B-electrode pads corresponding to all LED light-emitting chips are electrically connected to each other and are electrically connected through at least one of the metal vias to a common B-electrode pin corresponding to the column of pixel areas:

wherein the back surface of the insulation substrate is provided with an insulation layer covering back surface metal wires on the back circuit board and the metal vias electrically connected to the back surface metal wires;

wherein the back surface of the insulation substrate is provided with second identification marks for identifying polarities of pins;

wherein the insulation layer comprises two insulation materials of different colors, and a boundary line of the two insulation materials of different colors divides the insulation layer into two different colored portions to form the second identification marks.

2. The LED display unit group of claim 1, wherein a thickness of the front circuit board ranges 0.1 mm to 0.3 mm.

3. The LED display unit group of claim 1, wherein in each of the pixel areas, the B-electrode pads corresponding to the three LED light-emitting chips are different portions of a first metal pad, and the electrode B of each of the three LED light-emitting chips is electrically connected to a corresponding one portion among the different portions of the first metal pad.

4. The LED display unit group of claim 1, wherein in a same column of pixel areas, B-electrode pads corresponding to all LED light-emitting chips are different portions of a second metal pad, and the electrode B of each of all the LED light-emitting chips is electrically connected to a corresponding one portion among the different portions of the second metal pad.

5. The LED display unit group of claim 3, wherein n=1, and m=1;

in a same column of pixel areas, all B-electrode pads are arranged in a "1" shape along a column direction, two columns of B-electrode pads are disposed in edge areas on two opposite sides of the front circuit board, and A-electrode pads are disposed between the two columns of B-electrode pads.

6. The LED display unit group of claim 5, wherein in a same row of pixel areas, A-electrode pads corresponding to LED light-emitting chips of a same light emission color are different portions of a third metal pad, and the third metal pad is disposed along a row direction.

7. The LED display unit group of claim 4, wherein the second metal pad is directly electrically connected to the common B-electrode pin corresponding to the column of pixel areas through at least one of the metal vias.

8. The LED display unit group of claim 6, wherein the third metal pad is directly electrically connected to a corresponding A-electrode pin through at least one of the metal vias, or the third metal pad extends to the back circuit board through at least one of the metal vias and is electrically connected to a corresponding A-electrode pin through a metal wire on the back circuit board.

9. The LED display unit group of claim 1, wherein the front surface of the insulation substrate is provided with a first identification mark for position identification.

10. The LED display unit group of claim 1, wherein an ink layer is provided between adjacent rows of pixel areas; or an ink layer is provided between adjacent columns of pixel areas; or an ink layer is provided between adjacent rows of pixel areas and an ink layer is provided between adjacent columns of pixel areas.

11. The LED display unit group of claim 1, wherein the three LED light-emitting chips of different light emission colors comprise a red LED light-emitting chip, a green LED light-emitting chip, and a blue LED light-emitting chip.

\* \* \* \* \*